US005675208A

United States Patent [19]

Huang et al.

[11] Patent Number: 5,675,208

[45] Date of Patent: Oct. 7, 1997

[54] LITHIUM NIOBATE PIEZOELECTRIC TRANSFORMER OPERATING IN THICKNESS-SHEAR MODE

[75] Inventors: Jin Huang, Skokie; Brian M. Mancini, Carol Stream, both of Ill.

[73] Assignee: Motorola, Inc., Schaumburg, Ill.

[21] Appl. No.: 608,586

[22] Filed: Feb. 28, 1996

[51] Int. Cl.$^{6}$ .................................................... H01L 41/08

[52] U.S. Cl. .......................... 310/360; 310/320; 310/366

[58] Field of Search .................................... 310/360, 366, 310/316, 317, 319, 359, 320

[56] References Cited

U.S. PATENT DOCUMENTS

| | | | |
|---|---|---|---|
| 2,943,278 | 6/1960 | Mattiat | 310/366 |
| 3,487,239 | 12/1969 | Schafft | 310/359 |
| 3,582,839 | 6/1971 | Pim | 310/366 X |
| 3,591,813 | 7/1971 | Coquin | 310/360 |
| 3,727,084 | 4/1973 | Epstein | 310/360 |
| 3,735,161 | 5/1973 | Perkins et al. | 310/360 |
| 4,583,019 | 4/1986 | Yamada et al. | 310/360 |
| 5,229,680 | 7/1993 | Sato et al. | 310/366 X |
| 5,341,061 | 8/1994 | Zaitsu | 310/318 |
| 5,365,141 | 11/1994 | Kawai et al. | 310/359 |
| 5,371,430 | 12/1994 | Sato et al. | 310/359 |
| 5,424,602 | 6/1995 | Sato et al. | 310/359 |

*Primary Examiner*—Mark O. Budd

*Attorney, Agent, or Firm*—Gary J. Cunningham; Brian M. Mancini

[57] ABSTRACT

A piezoelectric transformer (10) operating in a thickness-shear vibration mode (26). The piezoelectric transformer (10) comprises a lithium niobate substrate (12) having first and second acoustically coupled portions (16,22), and a plurality of substantially opposing pairs of primary and secondary electrodes (14,20) disposed thereon. An input AC voltage applied to the primary electrode pairs (14) exciting a thickness-shear vibration (26) which couples to the secondary electrode pairs (20) producing an output AC voltage therebetween. The primary and secondary electrodes (14,20) being electrically connected in various combinations of parallel and series connections to provide a desired step-up or step-down voltage transfer ratio.

9 Claims, 5 Drawing Sheets

FIG.1A
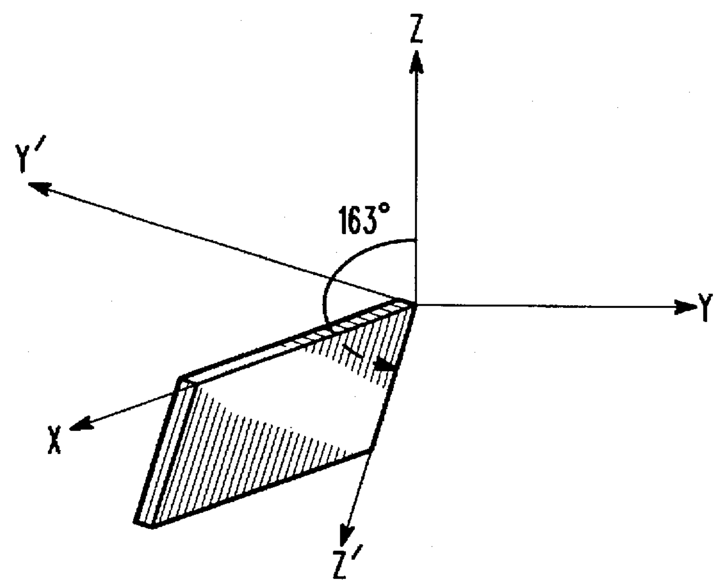
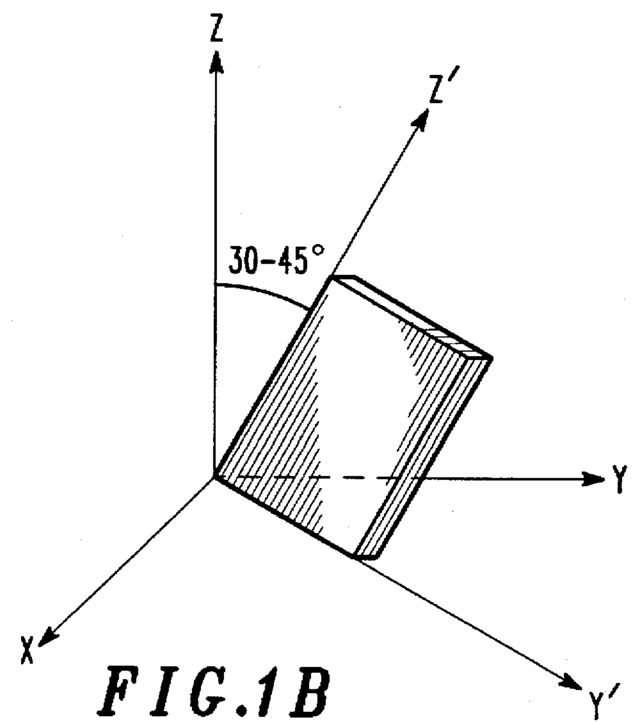
FIG.1B

FIG. 2
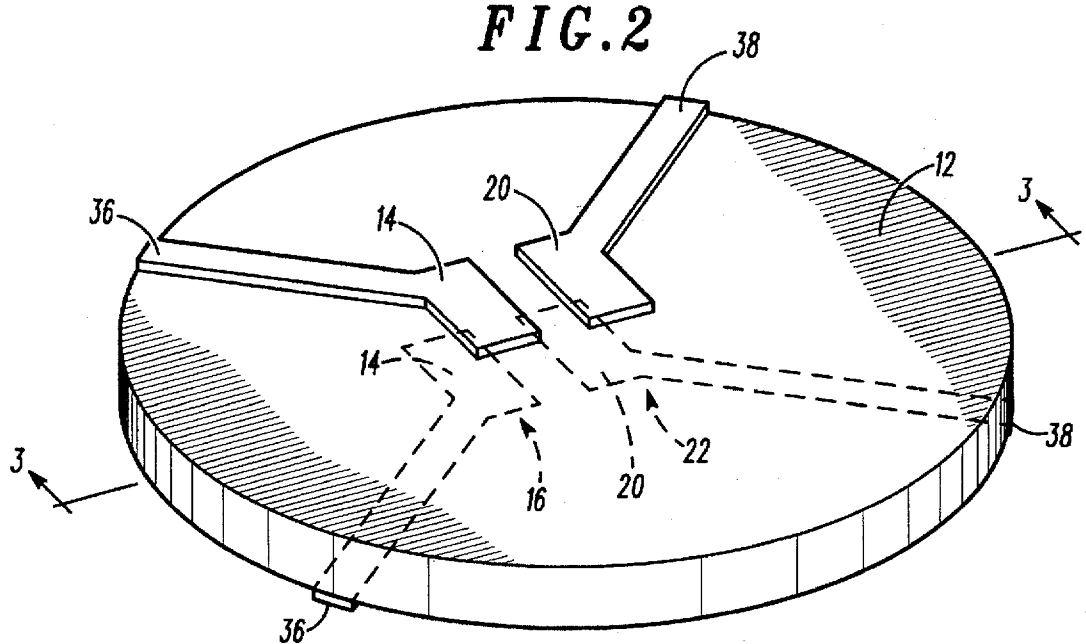
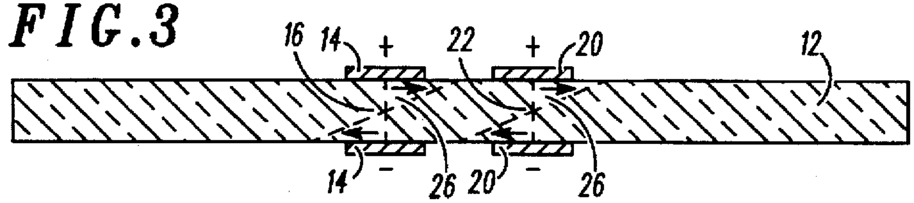
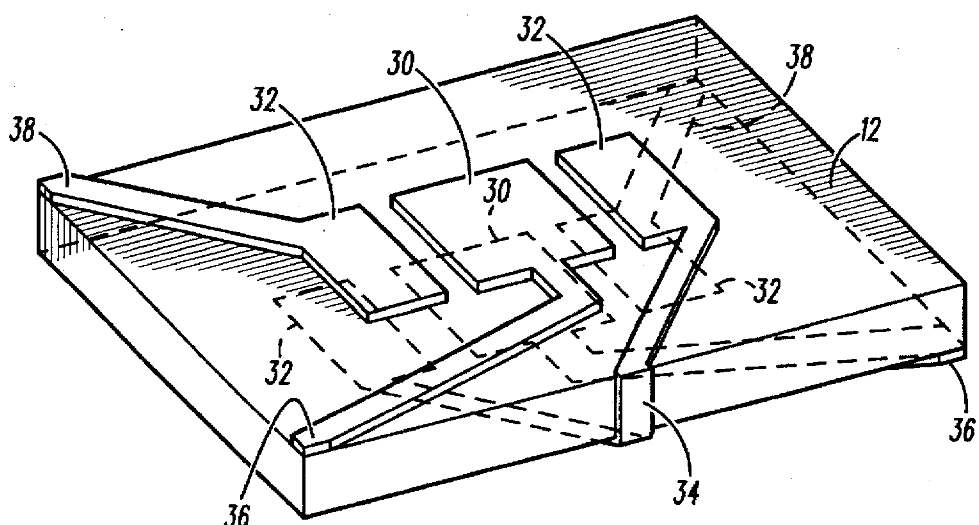
FIG. 4

FIG.5
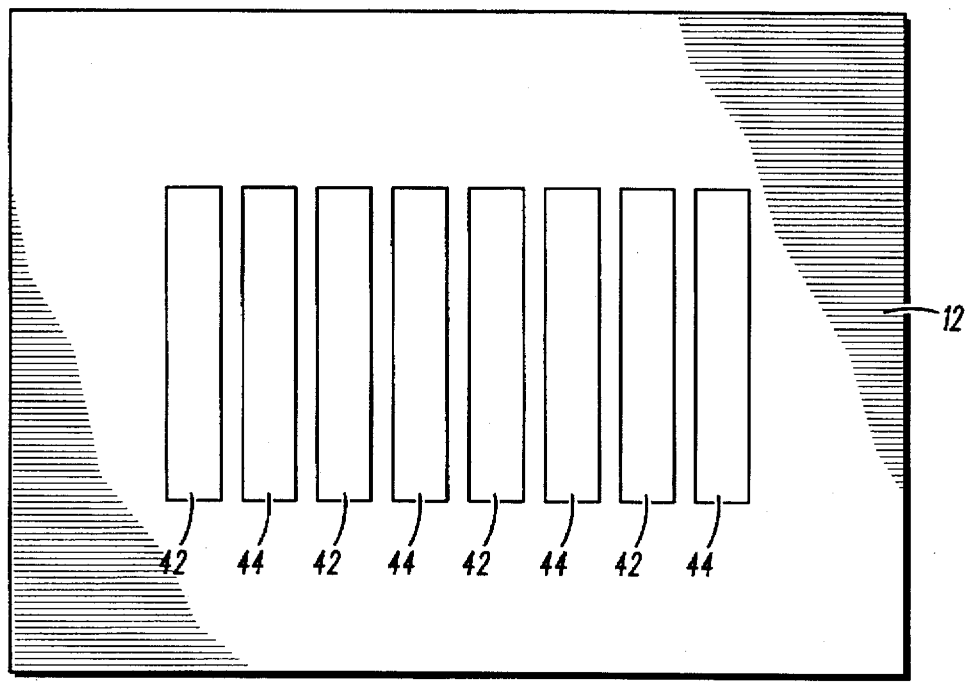
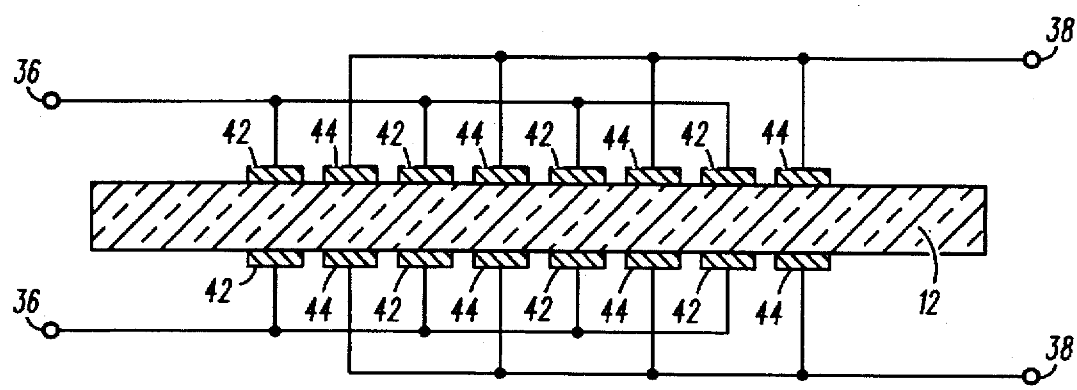
FIG.6

LITHIUM NIOBATE PIEZOELECTRIC TRANSFORMER OPERATING IN THICKNESS-SHEAR MODE

FIELD OF THE INVENTION

The present invention relates generally to piezoelectric devices and, in particular, to a lithium niobate piezoelectric transformer operating in thickness-shear mode.

BACKGROUND OF THE INVENTION

Voltage transformers have typically been realized in electromagnetic form. The electromagnetic transformer generally has a primary and secondary winding coupled electromagnetically by a magnetic core. Generally, these designs are bulky, heavy, they emit electromagnetic fields (EMF), and they saturate at high frequencies. However, there are applications that require low profile, electrical isolation, low EMF, or high switching frequency. These applications include switching power supplies, DC-DC converters, and general step-up or step-down transformers.

One approach to these issues has been piezoelectric transformers. In these designs, primary and secondary electrodes are provided on a piezoelectric substrate. A voltage applied to the primary electrodes induces a vibration in the piezoelectric material. In return, this vibration induces a voltage in the secondary electrodes. The coupling between the electrodes is mechanical, not electromagnetic as in conventional transformers. In this way, magnetic interference is significantly reduced while maintaining a small device size. However, a major issue with piezoelectric transformers has been power transfer efficiency and power handling capability.

In general, power handling capability is related to the piezoelectric material characteristics and the physical size of the device. In particular, the power handling capability of the device is proportional to the active area of the device. It would be advantageous to provide a piezoelectric transformer operating in a bulk acoustic wave mode. In this way, the power handling capability of the device is proportional to the volume of the active area of the transformer.

Power transfer efficiency is proportional to the material parameters, $k^2Q$, of the piezoelectric material, where k represents the piezoelectric coupling coefficient and Q represents the quality factor of the piezoelectric substrate. Transformers utilizing quartz as the piezoelectric material, although having a high Q factor, have not found wide acceptance because of its low coupling coefficient (about 0.1), low power handling capability, and sensitivity to load. Some other piezoelectric materials can provide a high coupling coefficient, k, but may not provide a suitable Q factor. Because of this, the selection of a piezoelectric material becomes a critical consideration in transformer design.

An important goal in the manufacture of piezoelectric transformers is to provide a low cost device. In order to be practical, a piezoelectric transformer should be cost competitive with electromagnetic transformers. One way to accomplish this is through a high yielding manufacturing operation using low cost materials. Another approach to this problem is to provide a simple design with large features. In this way, small variations from device to device, such as linewidth dimensions, will not adversely impact yields. Still another approach is to provide bulk processing of devices such as by the use of photolithographic processing.

There is a need for a piezoelectric transformer having values of k and Q that maximize efficiency, while retaining acceptable power handling capability by operating in a bulk acoustic wave mode. In addition, it is desirable to provide a low cost, low profile, high yield piezoelectric transformer and a structure that allows control of the transformer voltage ratio independent of external load and source impedances.

BRIEF DESCRIPTION OF THE DRAWINGS

FIGS. **1*a*–1*b* are diagrams explaining two crystallographic orientations of a piezoelectric substrate used for a piezoelectric transformer, in accordance with the present invention, FIG. 1 a being a Y-cut rotated about 163° degrees around an X-axis, FIG. 1*b*** being an X-cut rotated about 30° to 45° degrees around an X-axis;

FIG. 2 is a perspective view of a first embodiment of the piezoelectric transformer having a nominal 1:1 voltage transformation ratio and having a single pair of primary and a single pair of secondary electrodes, in accordance with the present invention;

FIG. 3 is a cross-sectional view of the piezoelectric transformer of FIG. 2 showing a complementary relationship of thickness-shear displacement and voltage polarity of the electrodes, in accordance with the present invention;

FIG. 4 is a perspective view of a second embodiment of the piezoelectric transformer having a nominal 1:2 voltage transformation ratio and having a single pair of primary and a dual pair of secondary electrodes connected in series and having a center tap connection, in accordance with the present invention;

FIG. 5 is a plan view of the piezoelectric transformer with a plurality of electrodes before being connected in primary and secondary configurations, in accordance with the present invention;

FIG. 6 is a cross-sectional view of an embodiment of FIG. 5 showing a parallel connection of primary and secondary electrodes forming a nominal 1:1 voltage transformer, in accordance with the present invention;

DETAILED DESCRIPTION OF THE PREFERRED EMBODIMENT

Figure 7:
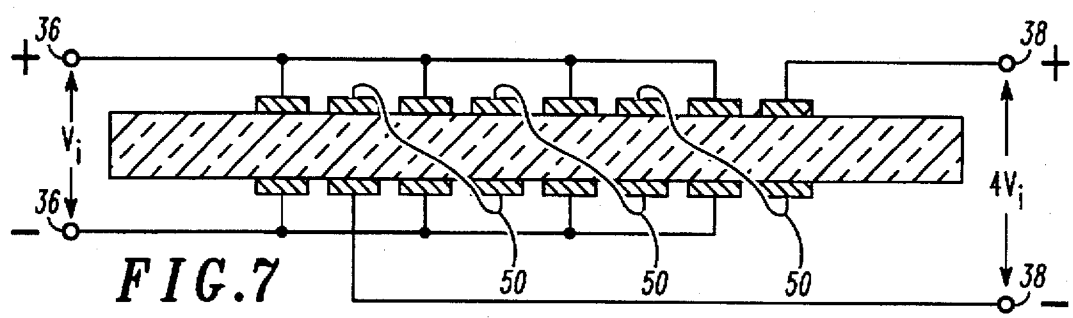
FIG. 7 is a cross-sectional view of an embodiment of FIG. 5 showing a parallel connection of primary electrodes and a series connection of secondary electrodes forming a 1:4 voltage transformer, in accordance with the present invention.

As shown in FIG. **1*a***, the present invention provides a high Q, low impedance Y-cut piezoelectric transformer having a crystallographic orientation, as defined by IEEE Standard 176–1978, rotated about 163° around an X-axis of a single crystal of lithium niobate. A substrate having top and bottom surfaces is cut from a single crystal ingot of lithium niobate having the X axis, Y axis and Z axis in correspondence to the crystal anisotropy. It should be noted that the foregoing orientation is chosen to obtain a substantially maximum piezoelectric coupling coefficient, $k_{24}$, of about 0.62. This orientation also coincides with a substantially optimum thickness-shear displacement. A thickness-shear mode may be defined as a mode of vibration of the substrate such that a standing wave is formed between the top and bottom surfaces of the substrate. A strain field formed by the standing wave is primarily shear strain dominated by particle displacement primarily in a direction parallel to the top and bottom surfaces.

Alternatively, a X-cut piezoelectric transformer having a crystallographic orientation rotated about 30° to about 45° around a X-axis of a single crystal of lithium niobate may be used. As shown in FIG. 1*b*, a substrate is cut with an orientation such that the substrate of the piezoelectric transformer lies in a plane perpendicular to the X-axis. It should be noted that the foregoing orientation is chosen to obtain a substantially maximum piezoelectric coupling coefficient, $k_{15}$, of about 0.69 at about a 31° rotation. However, the shear wave propagating in a thickness direction has a displacement at a direction of about 41° from the Y-axis. When an electrode pair, deposited on the substrate, is parallel or perpendicular to the direction of the displacement, fewer spurious frequencies will be generated in the transformer. Therefore, a substantially optimum thickness-shear displacement is obtained at about a 41° rotation with a corresponding reduction of coupling efficiency to about 0.68. An angle of about 41° was chosen for the invention. However, angles between about 30° to about 45° may be successfully used. It should be recognized that any piezoelectric material may be used successfully for piezoelectric transformers operating in a thickness-shear mode of vibration.

FIGS. 2 and 3 show a first embodiment of the piezoelectric transformer 10 having a nominal 1:1 voltage transfer ratio (turns ratio). However, it should be recognized that the impedance loading of a piezoelectric transformer will change the nominal voltage ratio of the transformer. A piezoelectric substrate 12 is provided whereupon a pair of primary electrodes 14 are deposited on substantially opposite sides of a first portion 16 of the piezoelectric substrate 12. A pair of secondary electrodes 20 are deposited on substantially opposite sides of a second portion 22 of the piezoelectric substrate 12.

Deposition methods for piezoelectric devices are well known in the art. Various layers of metal may be used equally well in the present invention. However, it should be noted that thicker layers of metal will increase the current carrying capability of the transformer. Aluminum may be used, but higher conductivity metals are preferred. An adhesion layer of chrome followed by a thicker layer of gold works well, but the cost of a thick layer of gold becomes prohibitive. A thin adhesion layer of a refractory metal such as chrome, followed by a much thicker layer of a highly conductive material such as copper or silver also works well. In a preferred embodiment, the thicker layer is followed by a thin final layer of a refractory metal such as chrome to inhibit oxidation of the thicker later. For the present invention, transformers have been successfully constructed using a deposition of chrome/silver/chrome in thicknesses, per side, of 0.02 μm/1.01 μm/0.021 μm, respectively, in addition to using a deposition of chrome/gold in thicknesses, per side, of 0.025 μm/0.251 μm, respectively, although different thicknesses and metals may be used equally well.

The metalization may be defined photolithographically or by means of a evaporative shadow mask, both of which are well known on the art. Both processes were tried successfully in the invention. The photolithographic process has the advantage of producing repeatable patterns, and is particularly suited for fine line geometries. The shadow mask process has the advantage of fewer processing steps and therefore is more timely. In particular, there is no need for a time consuming photolithographic etch of a thick film when using a shadow mask.

In operation, and as shown in FIG. 3, the first and second portions 16,22 are acoustically coupled through the piezoelectric substrate 12 by a thickness-shear mode of vibration 26. The primary electrode pair 14 piezoelectrically excite a thickness-shear vibration 26 in the first portion 16 of the piezoelectric substrate 12 when a predetermined input AC voltage is applied thereon. The input voltage should be of a frequency substantially equivalent to a natural resonant frequency of the piezoelectric substrate 12 which is substantially determined by the substrate thickness. The first portion 16 acoustically couples to the second portion 22, due to their proximity, and a corresponding thickness-shear vibration 26 is induced therein, which in turn piezoelectrically generates an output AC voltage at the secondary electrode pair 20. It should be recognized that the thickness-shear vibration 26 maintains the same voltage polarity among all electrodes on either side of the substrate 12. Although the fundamental mode of thickness-shear vibration 26 is shown in FIG. 3, there is nothing to preclude the use of higher-order harmonics in the operation of the transformer 10.

FIG. 4 shows a second embodiment of a piezoelectric transformer in a nominal 1:2 voltage transfer ratio. However, it should be recognized that the impedance loading of a piezoelectric transformer will change the nominal voltage ratio of the transformer. In this embodiment, a pair of primary electrodes 30 is acoustically coupled, through the substrate 12, to two pairs of secondary electrodes 32 which are connected in series by an electrical connection 34 from the top of one pair of secondary electrodes 32 around the edge of the substrate 12 to the bottom of the other pair of secondary electrodes 32. The electrical connection 34 may be used as an external center-tap connection as is found in conventional electromagnetic transformers. An input AC voltage is applied to a pair of primary leads 36 and an output AC voltage is taken from a pair of secondary leads 38.

As shown in FIG. 5, a plurality of interdigitated primary electrode pairs 42 and secondary electrode pairs 44 can be utilized in the present invention. The electrode pairs 42,44 of such an embodiment may be cascaded on the piezoelectric substrate 12 and then electrically connected to obtain any practical voltage ratio desired. The voltage ratio is limited by the number of electrode pairs 42,44 that can fit on the substrate 12 and the impedance loading of the device. The advantage of having fewer electrode pairs 42,44 is that electrode resistance may be minimized by increasing total available electrode area. The advantage of having more electrode pairs 42,44 is that acoustical coupling in the substrate 12 may be increased with increased interdigitation of electrode pairs 42,44. Many different configurations can be realized, some of which are shown in FIGS. 6 through 10. However, it should be recognized that the embodiments presented do not represent an exhaustive catalogue of possible configurations.

FIG. 6 shows one embodiment of the piezoelectric transformer of FIG. 5 having each of the primary and secondary electrode pairs 42,44 electrically connected in parallel resulting in a nominal 1:1 voltage transfer ratio. External access to the transformer is provided by a pair of primary leads 36 and secondary leads 38. Such a transformer may be used as an isolation device. Actual devices produced photolithographically on about 1 cm square substrates, about 0.2 mm thick, and having a total of twelve electrode pairs, each having a dimension of about 1 mm by 6 mm, demonstrated a power handling capability of two watts with no significant heating of the substrate 12. These devices exhibited input and output impedances of less than 5 ohms. Ten watts of continuous power can be tolerated with some heating, and it is envisioned that significantly more power could be handled in a switching power supply configuration. It should be recognized that many various shapes and sizes of electrodes 42,44 may be used equally well to achieve the desired results. In accordance with the present invention, various devices were built using rectangular primary and secondary electrodes 42,44 elongated in; either an X or Z' direction for the Y-cut substrate (see FIG. 1*a*), or a Y' or Z' direction for the X-cut substrate (see FIG. 1*b*).

FIG. 7 shows another embodiment of the piezoelectric transformer of FIG. 5 having a parallel connection of primary electrode pairs (shown as 42 in FIG. 5) and a series connection of secondary electrode pairs (shown as 44 in FIG. 5) forming a nominal 1:4 voltage transformer. Because the piezoelectrically produced voltage and polarity are identical at each of the primary and secondary electrode pairs 42,44 in thickness-shear mode, a series connection of four pairs of secondary electrodes 44 will produce nominally four-times the voltage that is input at the parallel connection of the four pairs of primary electrodes 42. In particular, a voltage, $V_i$, applied to the primary leads 36 provides nominally four-times the voltage, $4V_i$, at the secondary leads 38. Conversely, a voltage, $4V_i$, applied to the secondary leads 38 provides nominally one-fourth of the voltage, $V_i$, at the primary leads 36 due to the one-fourth voltage present at each pair of the primary 42 and secondary electrodes 44. Further, it should be recognized that each secondary electrode 44 may have an external connection 50 to provide a multi-tap function as is found in conventional electromagnetic transformers.

Figure 8:
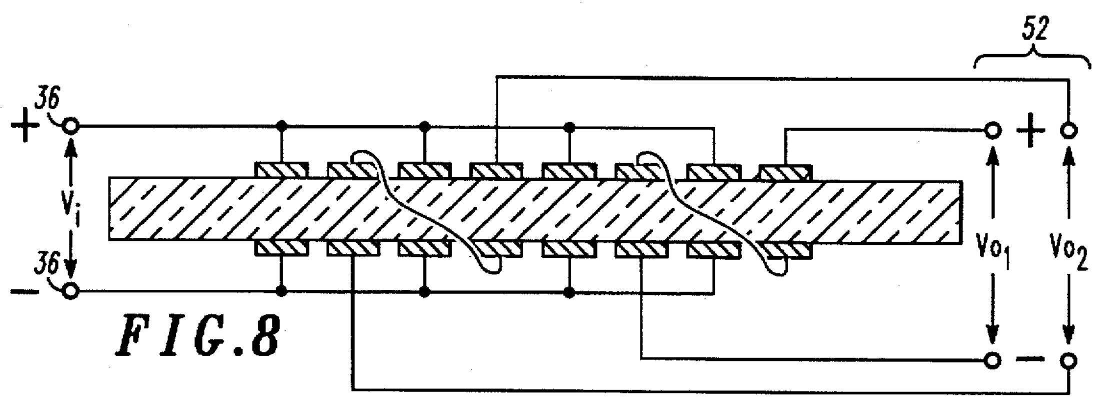
FIG. 8 is a cross-sectional view of an embodiment of FIG. 5 showing a parallel connection of primary electrodes and two series connections of secondary electrodes forming an isolated dual secondary nominal 1:2 voltage transformer, in accordance with the present invention.

FIG. 8 shows an embodiment of the piezoelectric transformer of FIG. 5 having a parallel connection of primary electrode pairs (shown as 42 in FIG. 5) and two independent series connections of secondary electrode pairs (shown as 44 in FIG. 5) forming a dual secondary transformer. Although this embodiment provides two separate secondary outputs 52 with a nominal 1:2 voltage ratio, it should be recognized that the voltage ratios of the secondaries ($V_{o1}/V_i$ and $V_{o2}/V_i$) are independent from each other and may be designed for different voltage ratios. In addition, the secondaries may be externally connected to provide a center-tap or multi-tap configuration as may be found in conventional electromagnetic transformer designs. Further, additional secondaries may be cascaded to increase the number and choices of output voltage ratios.

Figure 9:
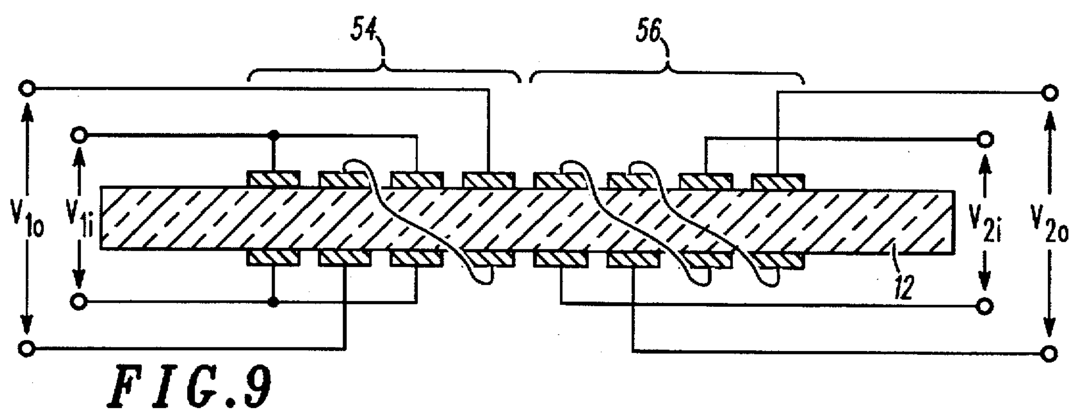
FIG. 9 is a cross-sectional view of an embodiment of FIG. 5 showing a parallel connection of first primary electrodes, a series connection of second primary electrodes, and two series connections of secondary electrodes forming two voltage transformers, in accordance with the present invention.

FIG. 9 shows an embodiment of two piezoelectric transformers on a single substrate 12, the first transformer 54 having a nominal 1:2 voltage ratio. The second transformer 56 having a nominal 1:1 voltage ratio. Although this embodiment provides two separate inputs ($V_{1i}$,$V_{2i}$)and outputs ($V_{1o}$,$V_{2o}$), the voltage ratios of the transformers are independent from each other and may be designed to be different. However, it should be recognized that the transformers 54,56 are still acoustically coupled to each other through the substrate 12 and that for the two transformers 54,56 to operate efficiently the applied voltages should provide substantially the same thickness-shear displacements and be in-phase. In this particular embodiment, the second input, $V_{2i}$, should be at about twice the voltage of, and be in-phase with, the first input, $V_{1i}$. Additional transformers can be added and are only limited by the available area of the substrate 12.

Figure 10:
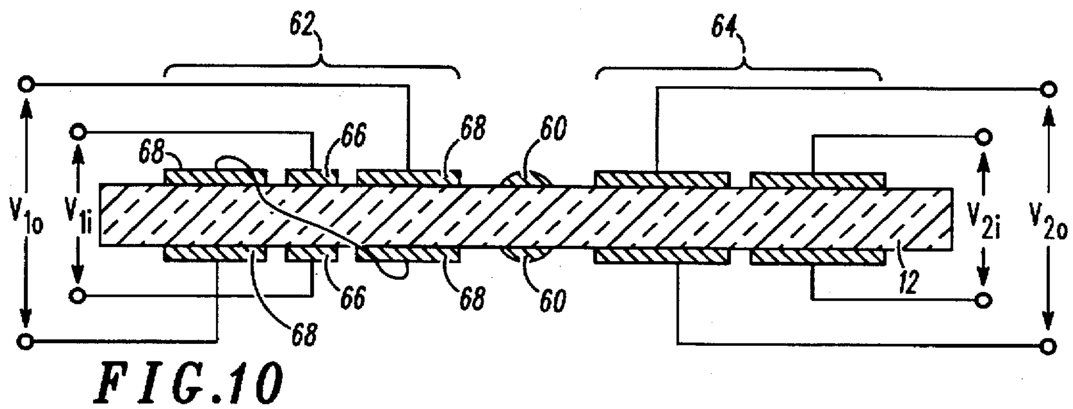
FIG. 10 is a cross-sectional view of an embodiment of FIG. 5 showing a parallel connection of first primary electrodes having a first primary impedance and a series connection of first secondary electrodes having a first secondary impedance forming a voltage and impedance transformer, and a parallel connection of second primary and secondary electrodes each having a second impedance and forming an impedance transformer, in accordance with the present invention.

FIG. 10 shows another embodiment of two transformers 62,64 similar to those of FIG. 9. However, in this instance damping material 60 has been added between the two transformers 62,64 to inhibit acoustic coupling therebetween. In this embodiment, the input voltages ($V_{1i}$,$V_{2i}$) of the two transformers 62,64 may be chosen completely independent of each other. The damping material 60 may be used as a mounting point for the piezoelectric substrate and also to provide external electrical connections through the mount. It should be recognized that compliant mounting is preferred for piezoelectric transformers, but that rigid mounting may be used, also.

The voltage transfer ratio of a piezoelectric transformer varies with changes in a source and load impedance presented to the transformer. This is in conjunction with internal impedances of the primary and secondary electrodes. The foregoing embodiments advantageously provide a structure for obtaining a desired voltage ratio that is independent of impedances presented to the transformer, although source and load impedances will still affect the final voltage ratio obtained. These impedance effects can be used advantageously to fine-tune the desired voltage ratio to non-integer values.

The impedances of the electrodes are affected by their respective areas and thicknesses. For example, doubling the area of the input electrodes in relation to the output electrodes will nominally halve the input resistance of a transformer. Further, connecting electrode pairs in series will raise their total resistance as compared to connecting them in parallel which will reduce their resistance. Conversely, parallel connections of electrode pairs will raise their total capacitance which also occurs with increasing the electrode size. Series connections of electrodes pairs will reduce capacitance which also occurs with reducing the electrode size. The invention may incorporate these impedance changes by design, thereby further enhancing selectivity of specific desired voltage transfer ratios. However, the invention has the advantage of designing for a step-up or step-down voltage transformer configuration while maintaining minimum internal impedances.

As shown in FIG. 10, for the nominal 1:2 voltage ratio transformer 62, the secondary electrode pairs 68 can be designed to each have twice the electrode area of the primary electrode pair 66 and therefore half the resistance of the primary electrode pair 66. The series connection of the secondary electrode pairs 68 will result in a doubling of total resistance thereby making the primary and secondary resistances equal. In addition, this configuration also results in an equivalent capacitance for the primary and secondary of the transformer 62. Further, the impedances of the transformer primary and secondary can be individually designed to substantially match any desired source or load impedance, thereby improving power transfer efficiency.

EXAMPLE

The following example serves to give illustration of the practice of this invention, and is not intended in any way to limit the scope of the invention.

A sample piezoelectric transformer was constructed as shown in FIG. 6 using a Y-cut polished substrate as shown in FIG. 1*a*. The transformer was chosen to have a thickness-shear resonant operating frequency of about 8 MHz and was designed with six pairs each of interdigitated primary and secondary electrode pairs being acoustically coupled in a Z'-direction. Each electrode being dimensioned about 1 mm in the Z'-direction and about 6 mm in an X-direction and separated by about 0.2 min. The top and bottom surfaces of the substrate were deposited with about 0.0251 μm of chrome followed by about 0.25 μm of gold and the electrodes were photolithographically defined. The substrate was cut on a dicing saw to about 1 cm square, and was mounted at the corners with conductive adhesive.

Figure 11:
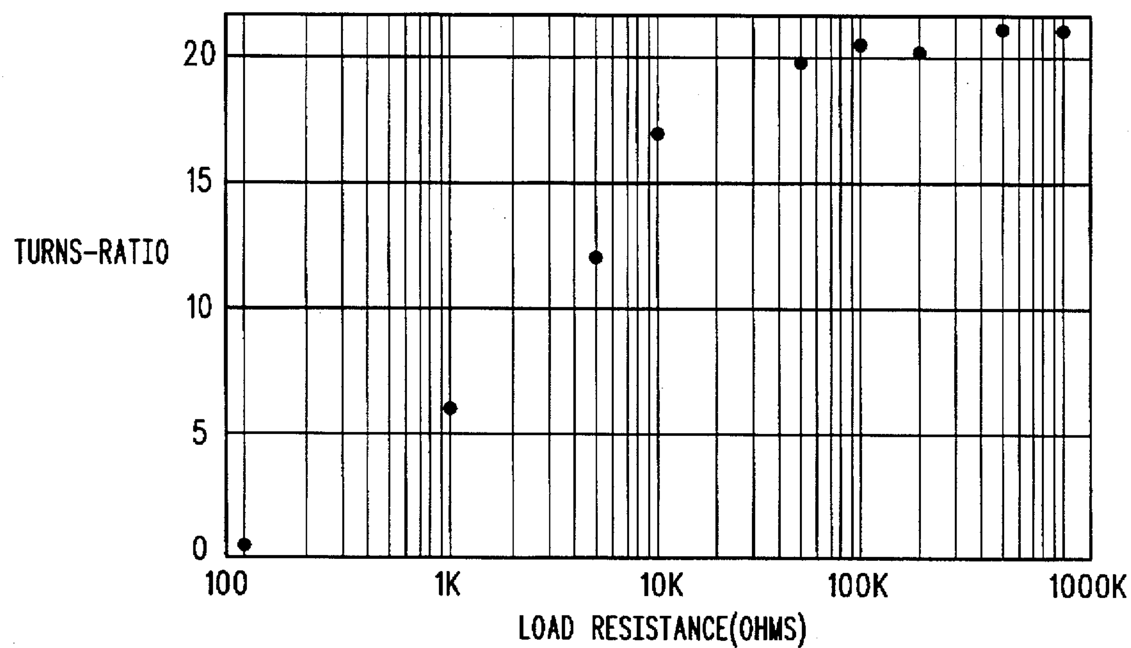

FIG. 11 shows the change of nominal voltage ratio (turns ratio) of the sample transformer with a change of load resistance. In this example, the load resistance was varied from about 100 ohms to about 1 Megaohm. As can be seen, the nominally designed 1:1 voltage transfer ratio of the sample transformer varied from about 0.5:1 to about 20:1 as the load resistance is increased.

Figure 12:
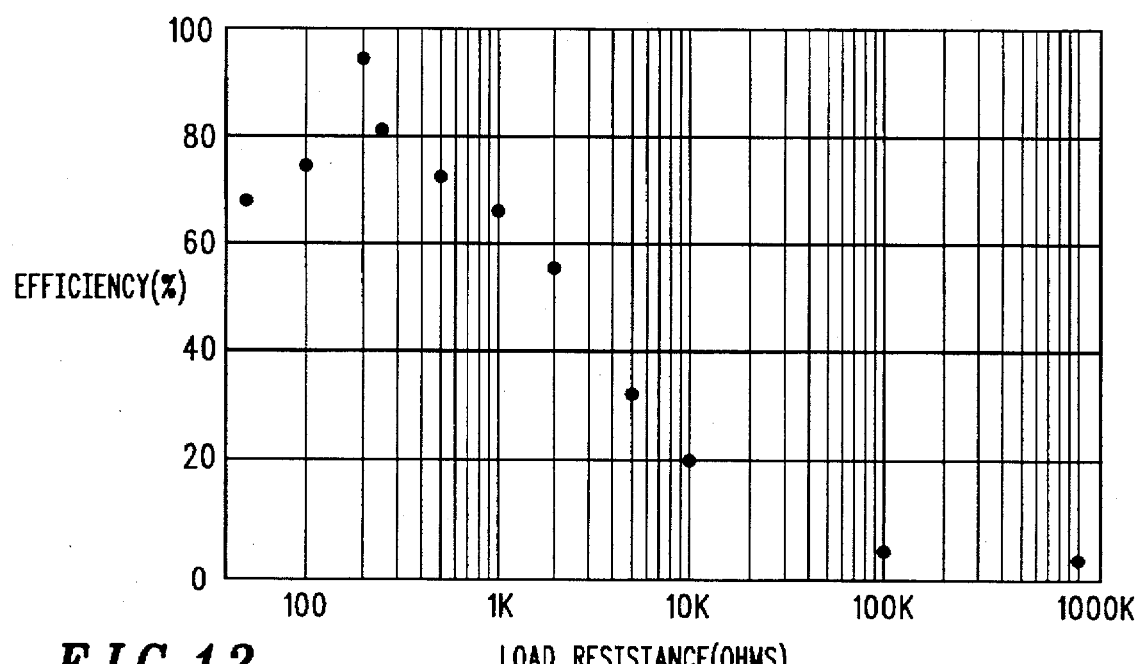

FIG. 12 shows the change of power transfer efficiency of the sample transformer, measured as total power out divided by total power in, with a change of load resistance. As can be seen, the sample transformer operates efficiently at a narrow range of load resistance. In this example, a peak efficiency of about 94% is achieved with a load resistance of about 200 ohms. However, operating at a 200 ohm load resistance provides an effective turns ratio of about 2:1, as shown in FIG. 11. Therefore, the transformer design of FIG. 6 operates most efficiently with about a 200 ohm load resistance to provide effectively an about 2:1 voltage transfer ratio.

However, the invention need not be limited to a 2:1 voltage ratio. The invention has the advantage of permitting series connection and impedance adjustment of the secondary electrode pairs (as shown in FIGS. 7 to 10) to allow a desired effective voltage transfer ratio independent of load resistance and efficiency limitations. Further, efficiency may be improved by mounting and electrode configuration.

In a preferred embodiment, the design of a thickness-shear transformer utilizes an electrode configuration that takes advantage of a thickness-shear model of energy-trapping. In this way, elastic energy of the transformer is confined substantially under an electroded area so that the transformer may be mounted along its edges without adversely affecting or damping thickness-shear vibrations. This improves power handling efficiency. However, power handling is proportional to the energy-trapped volume of the substrate and this does not preclude the use of an electrode configuration which substantially covers the piezoelectric substrate permitting elastic energy to extend to the substrate edges. Such a configuration would have the advantage of higher power handling capability at the expense of detrimental substrate edge effects. It should be recognized that the voltage handling capability of the device may be improved by providing a dielectric coating over the surface of the transformer to improve electrical isolation between the transformer primary and secondary.

Also, in a preferred embodiment, the electrode configuration and acoustic coupling are chosen to provide a wide operable frequency bandwidth, in accordance with well known piezoelectric filter design theory. In this way, the transformer can operate over a large temperature range without having the operating frequency drift out of a low impedance, resonance region. Conversely, an electrode configuration for a narrow bandwidth may be chosen to operate in conjunction with a phase-locked oscillator driving circuit. In this way, the transformer will always be locked to a minimum impedance resonant point even though the operating frequency may drift.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A single crystal lithium niobate piezoelectric transformer for providing a predetermined AC voltage transfer ratio, comprising:

a piezoelectric substrate selected from the group consisting of a crystallographic Y-cut being rotated approximately 163° about a crystallographic X-axis and a crystallographic X-cut being rotated from about 30° to about 45° around a crystallographic X-axis;

the piezoelectric substrate having first and second portions;

at least one pair of substantially opposing primary electrodes disposed on the first portion of the piezoelectric substrate, the at least one pair of primary electrodes exciting a thickness-shear vibration in the first portion of the piezoelectric substrate when an input AC voltage is applied thereto;

at least one pair of substantially opposing secondary electrodes disposed on the second portion of the piezoelectric substrate, the at least one pair of secondary electrodes providing an output AC voltage when the second portion of the piezoelectric substrate vibrates in a thickness-shear mode therebetween; and the first and second portions being acoustically coupled such that a thickness-shear wave excited in the first portion of the piezoelectric substrate produces a corresponding thickness-shear wave in the second portion of the piezoelectric substrate.

2. The piezoelectric transformer of claim 1, wherein the primary and secondary electrode pairs are located substantially distant from all edges of the piezoelectric substrate wherein when the transformer is energized elastic energy is confined substantially between the primary and secondary electrode pairs and away from the edges of the substrate such that the transformer is mountable along any edge without adversely dampening the thickness-shear vibration.

3. The piezoelectric transformer of claim 1, wherein the primary and secondary electrodes are interdigitated in a Z'-direction, and wherein each electrode has dimensions of about 1 mm in the Z'-direction and about 6 mm in an X-direction with a Z'-direction separation of about 0.2 mm therebetween.

4. The piezoelectric transformer of claim 1, wherein the at least one pair of primary electrodes are electrically connected in parallel and at least two pairs of secondary electrodes are connected in series such that a step-up voltage transfer ratio is obtained.

5. The piezoelectric transformer of claim 4, further comprising at least three electrical connections being coupled to at least two pairs of secondary electrodes such that a multi-tap transformer is obtained.

6. The piezoelectric transformer of claim 1, wherein at least two pairs of primary electrodes are electrically connected in series and the at least one pair of secondary electrodes are electrically connected in parallel such that a step-down voltage transfer ratio is obtained.

7. The piezoelectric transformer of claim 1, wherein at least two pairs of secondary electrode are located in proximity to the at least one pair of primary electrodes such that a multiple output transformer is obtained.

8. The piezoelectric transformer of claim 1, wherein at least two pairs of primary electrodes and at least two pairs of secondary electrodes are located on the piezoelectric substrate, the at least two pairs of primary electrodes being electrically and acoustically isolated from each other, and the at least two pairs of secondary electrodes being electrically and acoustically isolated from each other such that multiple transformers are obtained on the substrate.

9. A single crystal lithium niobate piezoelectric transformer for providing a predetermined AC voltage transfer ratio, comprising:

a piezoelectric substrate selected from the group consisting of a crystallographic Y-cut being rotated approximately 163° about a crystallographic X-axis and a crystallographic X-cut being rotated from about 30° to about 45° around a crystallographic X-axis;

the piezoelectric substrate having first and second portions, the first and second portions being acoustically coupled;

at least one pair of substantially opposing primary electrodes being electrically connected in parallel and disposed on the first portion of the piezoelectric substrate, the at least one pair of primary electrodes exciting a thickness-shear vibration in the first portion of the piezoelectric substrate when an input AC voltage is applied thereto;

at least two pairs of substantially opposing secondary electrodes being electrically connected in series and disposed on the second portion of the piezoelectric substrate, the at least two pairs of secondary electrodes being located interdigitally with and in proximity to the at least one pair of primary electrodes, the thickness-shear vibration of the first portion coupling to and providing a corresponding thickness-shear vibration in the second portion which subsequently generates an output AC voltage at the at least two pairs of secondary electrodes; and the primary and secondary electrode pairs are located substantially distant from all edges of the piezoelectric substrate wherein when the transformer is energized elastic energy is confined substantially between the primary and secondary electrode pairs and away from the edges of the substrate such that the transformer is mountable along any edge without adversely dampening the thickness-shear vibration.

* * * * *